United States Patent [19]
Katto et al.

[11] Patent Number: 5,286,666
[45] Date of Patent: * Feb. 15, 1994

[54] METHOD OF PRODUCING SEMICONDUCTOR MEMORY DEVICE

[75] Inventors: Hisao Katto, Hinode; Jun Sugiura, Musashino, both of Japan

[73] Assignee: Hitachi, Ltd., Tokyo, Japan

[*] Notice: The portion of the term of this patent subsequent to May 26, 2009 has been disclaimed.

[21] Appl. No.: 843,599

[22] Filed: Feb. 28, 1992

Related U.S. Application Data

[63] Continuation of Ser. No. 396,686, Aug. 22, 1989, Pat. No. 5,116,775, which is a continuation of Ser. No. 63,110, Jun. 17, 1987, abandoned.

[30] Foreign Application Priority Data

Jun. 18, 1986 [JP]  Japan ............................ 60-140061

[51] Int. Cl.$^5$ ........................................... H01L 21/70
[52] U.S. Cl. ...................... 437/52; 437/26; 437/27; 437/28; 437/47; 437/48; 437/60
[58] Field of Search .............. 437/26, 27, 28, 29, 437/47, 48, 52, 56, 60, 191, 193, 195, 228, 233, 235; 357/23.6, 51

[56] References Cited

U.S. PATENT DOCUMENTS

| | | | |
|---|---|---|---|
| 4,326,329 | 4/1982 | McElroy | 437/70 |
| 4,352,236 | 10/1982 | McCollum | 437/70 |
| 4,388,121 | 6/1983 | Rao | 437/47 |

FOREIGN PATENT DOCUMENTS 0087340  7/1981  Japan .................................. 437/26

*Primary Examiner*—Tom Thomas
*Attorney, Agent, or Firm*—Antonelli, Terry, Stout & Kraus

[57] ABSTRACT

A heavily-doped semiconductor region and a channel stopper region, which are disposed under a memory cell in a memory cell region, are simultaneously formed after formation of a field insulator film, thereby preventing the channel stopper region from oozing out into the channel region, and thus obtaining a semiconductor memory device which is resistant to α-rays and therefore free from soft errors caused by α-rays. Also disclosed is a method of producing said semiconductor memory device.

49 Claims, 8 Drawing Sheets

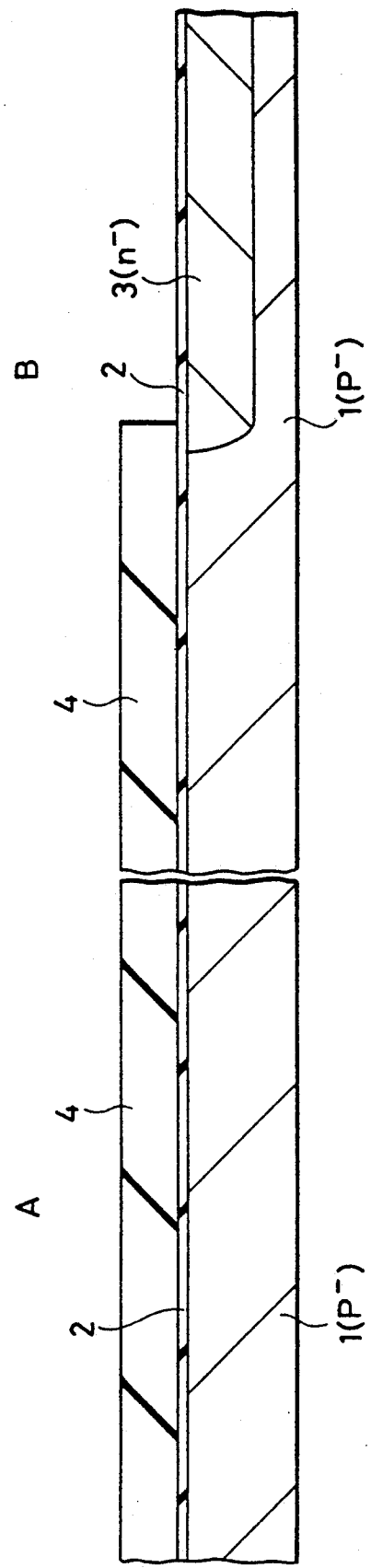
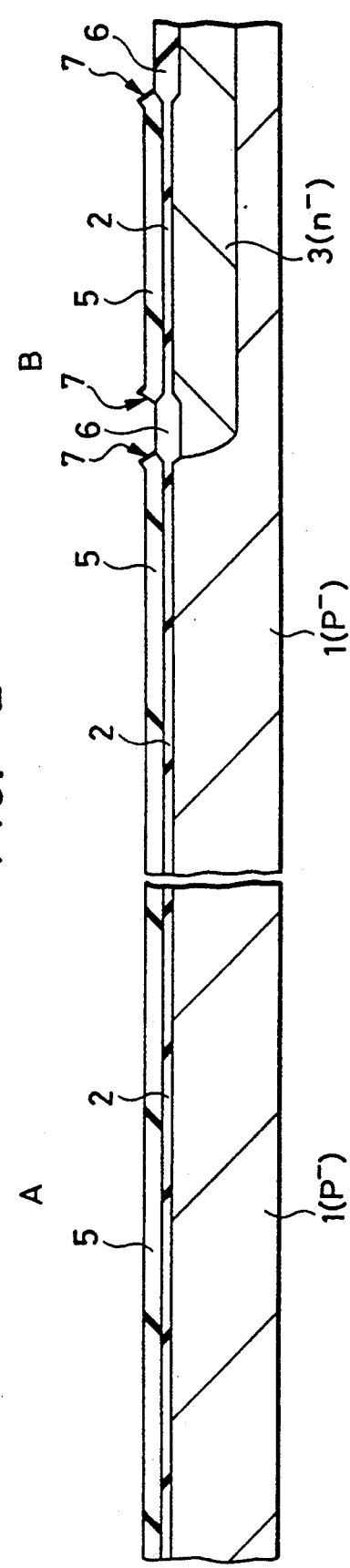

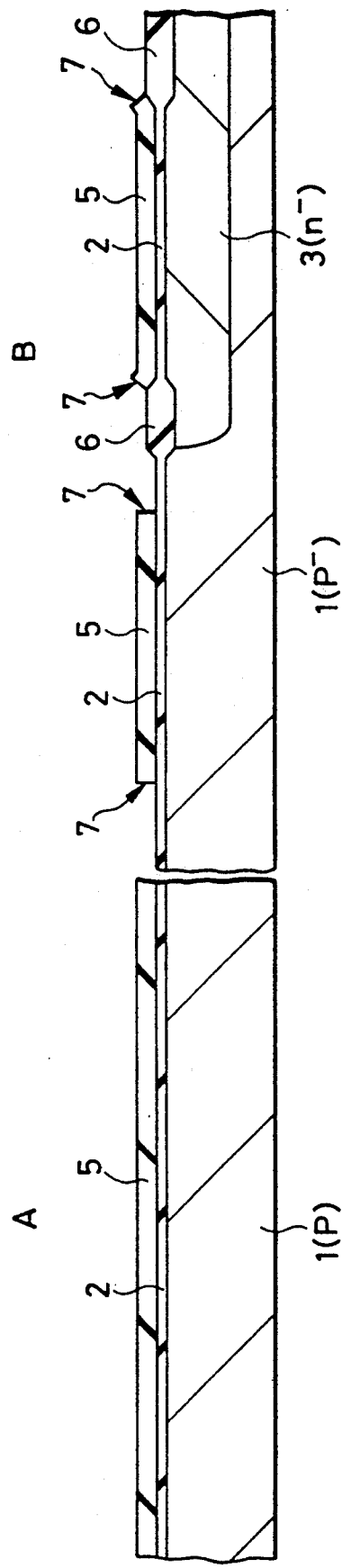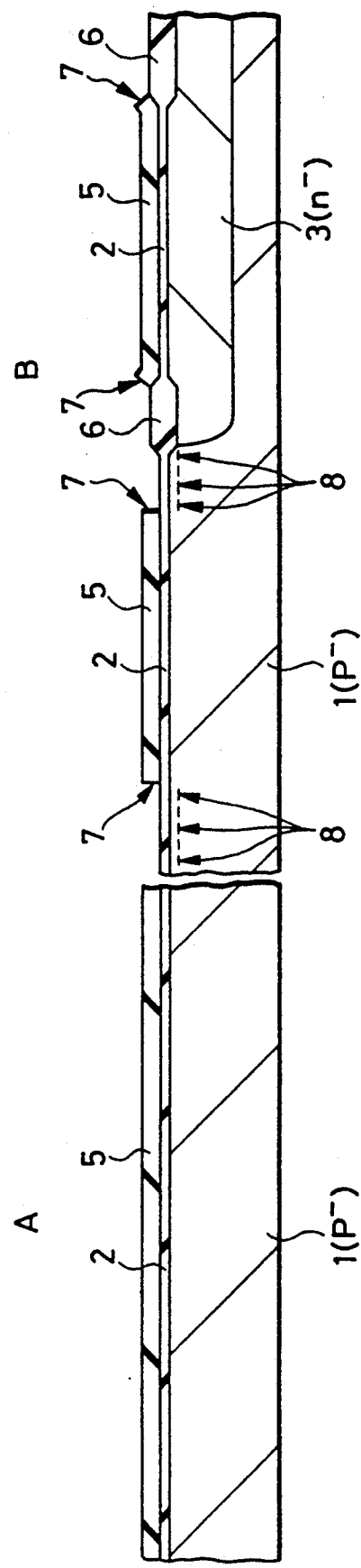

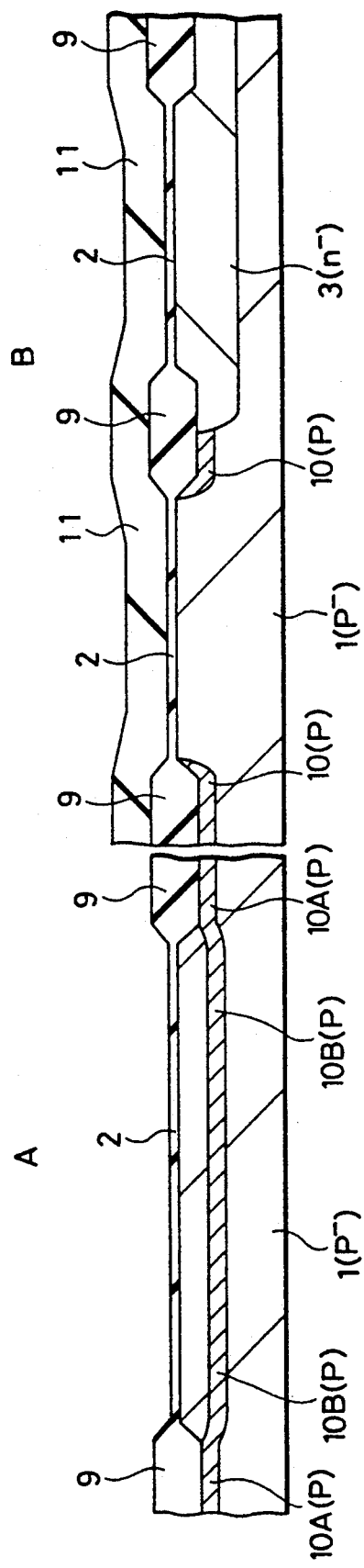
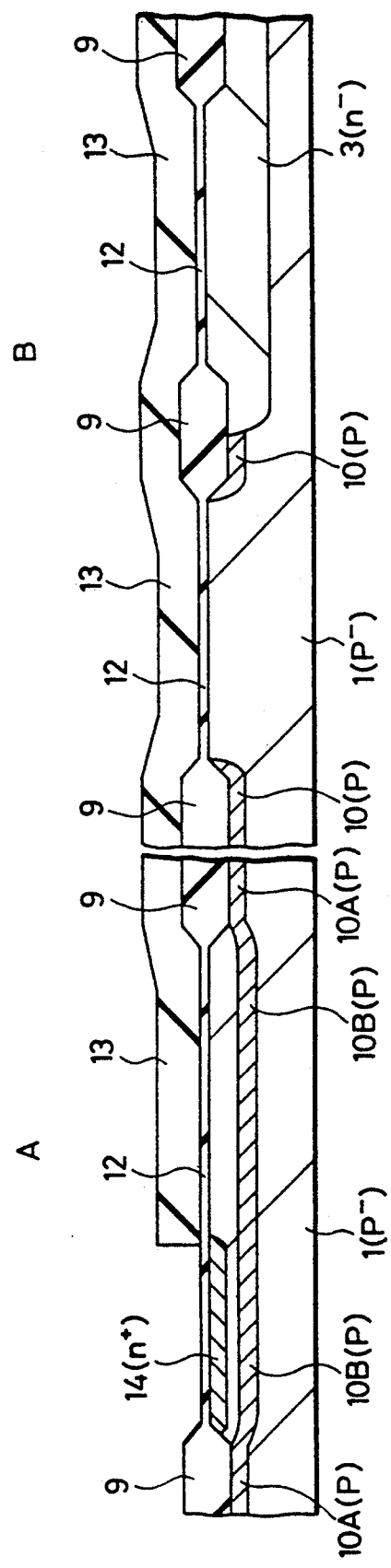
FIG. 7
FIG. 8

METHOD OF PRODUCING SEMICONDUCTOR MEMORY DEVICE

This application is a continuation application of application Ser. No. 07/396,686, filed Aug. 22, 1989, now U.S. Pat. No. 5,116,775, which is a continuation application of application Ser. No. 07/063,110, filed Jun. 17, 1987, now abandoned.

BACKGROUND OF THE INVENTION

The present invention relates to a semiconductor memory device and, more particularly, to element isolation and α-ray soft error prevention techniques for dynamic random-access memories (hereinafter referred to as "DRAM's").

Isolation of semiconductor elements from each other is generally effected by a combination of a field insulator film defined by a silicon oxide film formed by oxidation of the surface of a semiconductor substrate and a channel stopper region. An impurity for forming a channel stopper region is introduced by ion implantation before formation of a field insulator film, and the introduced impurity is diffused by making use of heat which is applied to the semiconductor substrate when thermal oxidation is effected in order to form a field insulator film. A technique similar to that described above is used in isolation of elements in a DRAM. It should be noted that techniques related to element isolation are described, for example, in "VLSI Device Handbook", Science Forum, Nov. 28, 1983, page 63.

Soft errors in DRAM's are mainly caused by generation of electron-hole pairs by α-rays. As known techniques used to prevent generation of soft errors by α-rays, there is one example in which a heavily-doped semiconductor region which serves as a potential barrier against the electron-hole pairs is formed under a region on a semiconductor substrate in which memory cells are to be formed. An impurity for forming the heavily-doped semiconductor region is introduced under an active region in a memory cell region, after the formation of a field insulator film defined by a silicon oxide film formed by oxidation of the surface of the semiconductor substrate, by ion implantation using the field insulator film as a mask. Such a DRAM soft error preventing technique is described, for example, in the specification of Japanese Patent Laid-Open No. 94451/1984.

A channel stopper region is formed prior to the formation of a field insulator film defined by a silicon oxide film formed by oxidation of the surface of the semiconductor substrate, and after the formation of the field insulator film, a heavily-doped semiconductor region (hereinafter also referred to as an "impurity-introduced region" for convenience) on the semiconductor substrate and under a region in which a Metal Insulator Semiconductor Field Effect Transistor (MISFET: hereinafter referred to as a "MISFET") is to be formed for the purpose of lowering the substrate resistance in order to prevent latchup of a Complementary Metal Oxide Semiconductor (CMOS: hereinafter referred to as "CMOS"). An impurity for forming the heavily-doped semiconductor region is introduced under the region in which a MISFET is to be formed by ion implantation carried out through the field insulator film. The channel stopper region formed as described above and the heavily-doped semiconductor region are connected together under the field insulator film and formed in such a manner as to surround the region in which a MISFET is to be formed. Such a technique is described, for example, in the specification of Japanese Patent Laid-Open No. 10268/1986.

SUMMARY OF THE INVENTION

The present inventors examined the above-described techniques and found the following problems.

The step of introducing an impurity for forming a channel stopper region is carried out before the formation of a field insulator film, while the step of introducing an impurity for forming a heavily-doped semiconductor region for the purpose of preventing generation of soft errors is carried out after the formation of the field insulator film. In other words, these steps are executed independently of each other, which results in an increase in the number of steps. If a channel stopper region is formed before the formation of the field insulator film, the channel stopper region oozes out into the channel region of the MISFET by the heat applied to the substrate at the time of formation of the field insulator film, causing said channel region to be narrowed, and resulting in an increase in the threshold value of the MISFET.

The way in which the above-described channel stopper region oozes out into the channel region of the MISFET will be explained below with reference to FIGS. 15 and 16. FIG. 15 is a plan view of a part of a region in which a MISFET is formed, and FIG. 16 is a sectional view taken along the line A'—A' of FIG. 15. It should be noted that FIG. 15 illustrates no insulator films other than a field insulator film (the pattern configuration of which is shown alone) in order to facilitate understanding of the arrangement of the MISFET. As shown in FIG. 15, a MISFET consists of a gate electrode 18' (WL) and source and drain diffused regions 19' which are formed at both ends, respectively, of the gate electrode 18: The MISFET is surrounded with an field insulator film pattern 9', and a channel stopper 10A' is formed under the field insulator film pattern 9'. The channel stopper 10A' is oozed out from the vicinities of regions Z of the channel stopper region 10A' into the channel region Y of the MISFET as shown in FIG. 16 by the heat applied to the substrate at the time of formation of the field insulator film. For this reason, the channel region is narrowed, and the threshold value of the MISFET is increased.

It is an object of the present invention to provide a semiconductor memory device having improved reliability, for example, a semiconductor memory device which is resistant to α-rays, together with a method of producing such a semiconductor memory device.

It is another object of the present invention to provide a semiconductor memory device having improved electrical characteristics, for example, a semiconductor memory device in which a MISFET has a lowered threshold value, together with a method of producing such a semiconductor memory device.

The following is a brief summary of a representative one of the inventions disclosed in this application.

Namely, after formation of a field insulator film, an impurity for forming a channel stopper region is introduced through the field insulator film and, at the same time, an impurity for forming a heavily-doped semiconductor region serving as a potential barrier under a memory cell is introduced.

According to the above-described means, it is possible to prevent the channel stopper region from oozing out into the channel region of the MISFET and, at the same time, to form a heavily-doped semiconductor region serving as a potential barrier under the active region in the memory cell region, so that it is possible to provide a semiconductor memory device having improved electrical characteristics and enhanced reliability.

BRIEF DESCRIPTION OF THE DRAWINGS

FIGS. 1 to 10 are sectional views showing a memory cell region and a peripheral circuit region of a semiconductor memory device in accordance with the embodiment I in successive steps of the process for producing the same;

DESCRIPTION OF THE PREFERRED EMBODIMENTS

Figure 5:
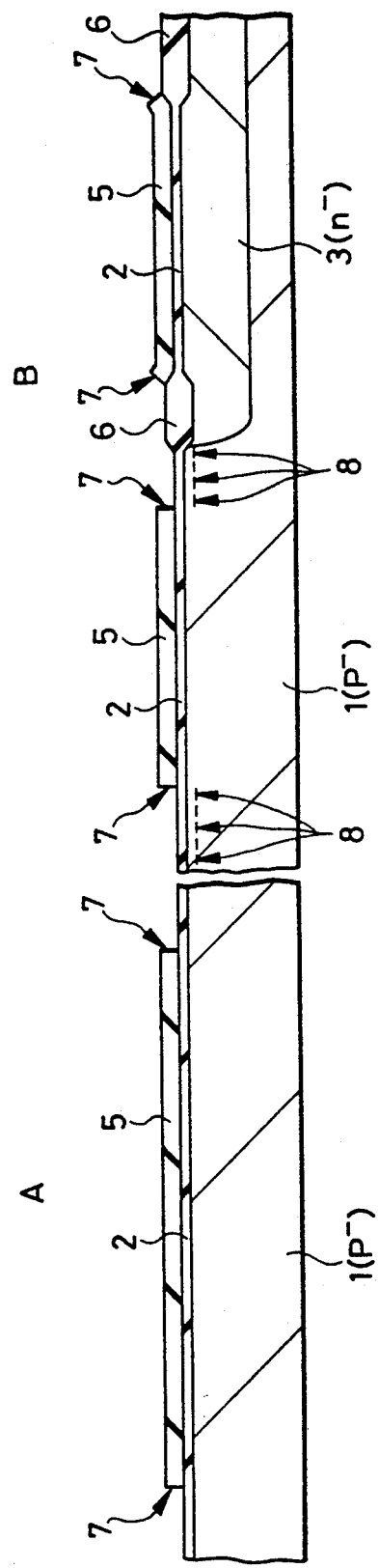

One embodiment of the present invention will be described hereinunder in accordance with the process for producing a dynamic RAM.

Referring to FIGS. 1 to 10, which are views employed to describe the process for producing a dynamic RAM, the region A is a sectional view of a memory cell region, and the region B is a sectional view of a peripheral circuit region for forming a peripheral circuit such as a decoder, an address buffer or a sense amplifier.

As shown in FIG. 1, a silicon oxide film 2 which serves as a ground film is formed by oxidizing the whole surface of a semiconductor substrate 1 formed from $p^-$-type single crystal silicon in order to form an $n^-$-type well region 3 in the region B of the semiconductor substrate 1. Then, a mask 4 which is defined by a resist film is formed. The mask 4 has an opening above a region in the region B in which the $n^-$-type well region 3 is to be formed. Then, an n-type impurity, for example, phosphorus (P), is introduced by ion implantation. Thereafter, the mask 4 is removed, and the semiconductor substrate 1 is annealed to diffuse the impurity and to thereby form the $n^-$-type well region 3.

Referring next to FIG. 2, an oxidation resistance mask 5 which is defined by a silicon nitride film for thermal oxidation carried out to form a field insulator film 9 (see FIG. 6) is formed on the semiconductor substrate 1 by, for example, Chemical Vapor Deposition (hereinafter referred to as "CVD"). Then, the oxidation resistance mask 5, which is located in a portion of the surface of the $n^-$-type well region 3 among regions in the region B in which the field insulator film 9 is to be formed, is removed by etching using a mask (not shown) defined by a resist film to form an opening 7. A portion of the surface of the $n^-$-type well region 3 is exposed in the opening 7. The mask (not shown) defined by a resist film employed to provide the opening 7 in the oxidation resistance mask 5 is removed after the formation of the opening 7. Then, the portion of the surface of the $n^-$-type well region 3 which is exposed from the oxidation resistance mask 5 is oxidized to form a silicon oxide film 6 having a thickness of about 500 Å. The film 6 serves as a mask used when ion implantation is carried out to form a channel stopper region 10 (see FIG. 6) in the region B, and the film 6 is to become a part of the field insulator film 9 afterward.

Next, as shown in FIG. 3, a portion of the mask 5 in the region B, which was not removed in the step shown in FIG. 2 but is left covering the region in which the field insulator film 9 is to be formed, is removed by etching using a mask (not shown) defined by a resist film to enlarge the opening 7.

Then, as shown in FIG. 4, a p-type impurity 8, for example, boron (B), for forming a channel stopper region 10 (see FIG. 6) in the region B is introduced by ion implantation using the mask 5 and the silicon oxide film 6 as a mask. The energy for implantation of the p-type impurity is, for example, about 60 KeV. At this time, the p-type impurity for forming a channel stopper is not introduced into the region A (memory cell region).

Thus, in accordance with this embodiment, the impurity 8 for forming the channel stopper region 10 is introduced into the peripheral circuit region (region B) before the formation of the field insulator region 9.

Referring next to FIG. 5, that portion of the oxidation resistance mask (silicon nitride film) 5 which is on a region in the region A in which the field insulator film 9 is to be formed, is removed by etching using a mask (not shown) defined by a resist film to form an opening 7 in the region A. The mask (not shown) defined by a resist film is removed after the etching.

Figure 6:
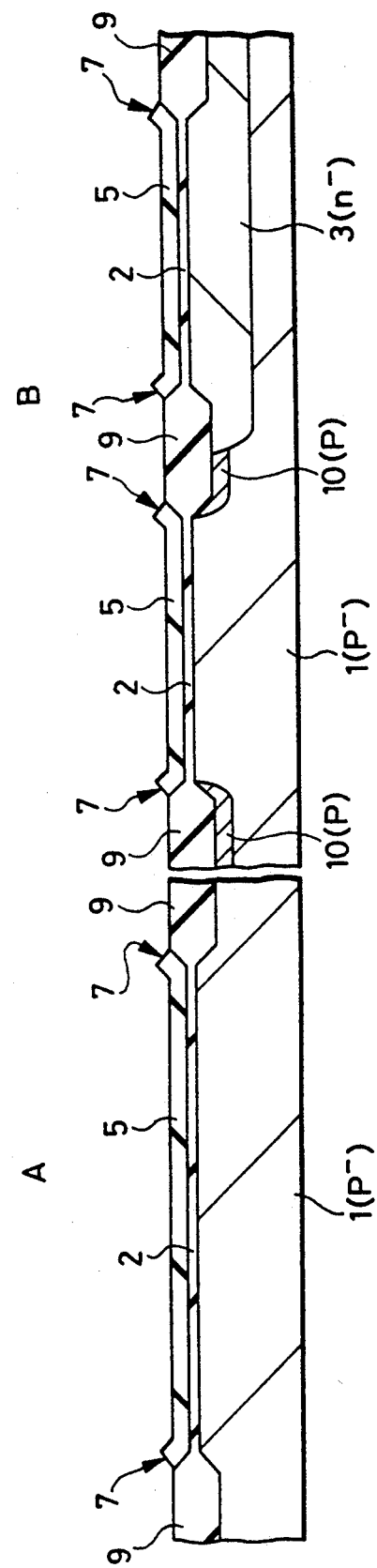

Then, as shown in FIG. 6, in the regions A and B, the surface of the semiconductor substrate 1 and the surface of the $n^-$-type well region 3 which are exposed through the oxidation resistance mask 5 are subjected to thermal oxidation to form a field insulator film 9 defined by a silicon oxide film. The thickness of the field insulator film 9 is set at about 4500 Å. The thickness of the field insulator film 9 formed by thermal oxidation of the surface of the $n^-$-type well region 3 is slightly larger than 4500 Å, although this is not discernibly illustrated in FIG. 6. During this thermal oxidation, the p-type impurity, e.g., boron (B), which has been introduced in the region B is diffused to form a p-type channel stopper region 10 in the region B. In this step, no channel stopper region 10 is formed in the region A. After the formation of the field insulator film 9, the oxidation resistance mask 5 defined by a silicon nitride film is removed.

Referring next to FIG. 7, a mask 11 defined by a resist film is formed in the region B in order to carry out ion implantation for forming a channel stopper region 10 in the region A. All the memory cell array region, that is, the region A, is exposed through the mask 11. Then, a p-type impurity, for example, boron (B), is introduced into the region A by ion implantation carried out through the field insulator film 9, and annealed to simultaneously form a channel stopper region 10A and a p-type semiconductor region 10B. The implantation energy is set at about 200 KeV, and the dose is set at about $5 \times 10^{12}$ atoms/cm$^2$. The above-described annealing is effected for the purpose of diffusing and activating the introduced p-type impurity. The mask 11 defined by a resist film is removed after the ion implantation.

The impurity for forming the channel stopper region 10A and the p-type semiconductor region 10B is introduced into the surface region of the semiconductor substrate 1 under the field insulator film 9 in the region A through the same film 9. Further, the impurity, which is introduced into the principal surface portion of the semiconductor substrate 1 which is exposed through the field insulator film .9, is implanted into a region in the semiconductor substrate 1 which is deeper than the impurity introduced under the field insulator film 9 so that the peak of the concentration distribution is about 5000 Å under the surface of the semiconductor substrate 1.

Thus, in the memory cell region, that is, the region A, the channel stopper region 10A is formed after the formation of the field insulator film 9. In this way, the heat applied at the time of thermal oxidation carried out to form the field insulator film 9 is prevented from being applied to the channel stopper region 10A in the region A, thereby suppressing diffusion of the channel stopper region 10A. The p-type semiconductor region 10B, which is formed simultaneously with the channel stopper region 10A, serves as a potential barrier against electron-hole pairs generated by a-rays entering the semiconductor substrate 1. It should be noted that the annealing, which is carried out in order to diffuse and activate the p-type impurity introduced for forming the channel region 10A and the p-type semiconductor region 10B in the region A, may be effected by, for example, annealing of an impurity for forming source and drain regions of a MISFET which is to be formed afterward. Further, in order to increase the storage capacity, the field insulator film 9 in the memory cell region may slightly be etched before the introduction of the p-type impurity so that the field insulator film 9 is further thinner than the field insulator film 9 in a high-voltage circuit portion of a peripheral circuit having a channel stopper region 10 (see FIG. 6). Since the above-described etching enables a reduction in the width of the field insulator film 9 in the memory cell region, the element forming region can be enlarged, so that it is also possible to enlarge the area of the storage capacity region.

Then, as shown in FIG. 8, the silicon oxide film 2, which serves as a ground film and has been contaminated by ion implantation and other treatments, is removed by etching, and the surface of the semiconductor substrate 1 exposed through the field insulator film 9 is oxidized to form a dielectric film 12 defined by a silicon nitride film. The dielectric film 12 is provided in order to constitute a capacitance element of a memory cell and formed so as to have a thickness of about 70 Å. In this step, the dielectric film 12 is formed not only in the region A (memory cell region) but also in the region B (peripheral circuit region). Then, a mask 13 which is defined by a resist film is formed over a part of the region A and over the region B for the purpose of carrying out ion implantation for forming an n+-type semiconductor region 14 in a predetermined portion in the region A, the semiconductor region 14 serving as one of the electrodes of the capacitance element. The mask 13 covers the selecting MISFET region in the region A and covers the whole of the region B. An n-type impurity, for example, arsenic (As), is introduced by ion implantation into the surface of the semiconductor substrate 1 in the region A exposed through the mask 13, and annealed in a nitrogen (N$_2$) atmosphere to form an n+-type semiconductor region 14. The energy for implantation of the n-type impurity (As) is set at about 80 KeV, and the dose is set at about $2 \times 10^{14}$ atoms/cm$^2$. The mask 13 defined by a resist film is removed after the ion implantation.

Figure 9:
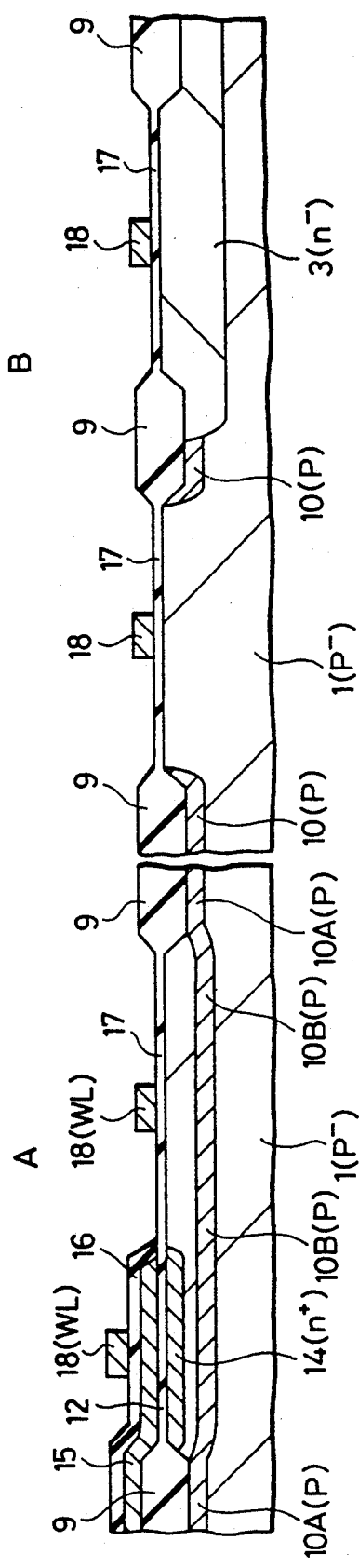

Referring next to FIG. 9, a polycrystalline silicon film is formed all over the regions A and B by, for example, CVD, for the purpose of forming a conductive plate 15 serving as the other electrode of the capacitance element. The polycrystalline silicon film is patterned by etching using a mask (not shown) defined by a resist film to form a conductive plate 15. The mask employed for the etching is removed after the formation of the plate 15. Then, the exposed surface of the conductive plate 15 defined by the polycrystalline silicon film is oxidized to form an insulator film 16 defined by a silicon oxide film. That portion of the dielectric film 12 which is exposed through the field insulator film 9 and the insulator film 16 is removed to expose the surface of the semiconductor substrate 1, and the exposed surface is oxidized to form a gate insulator film 17 defined by a silicon oxide film. The thickness of the gate insulator film 17 is set at about 200 Å. Then, a polycrystalline silicon film is formed all over the semiconductor substrate 1 by, for example, CVD, and patterned by etching using a mask (not shown) defined by a resist film to form gate electrodes 18 and word lines WL in the region A and gate electrodes 18 in the region B. It should be noted that the gate electrodes 18 and the word lines WL may be formed from a film of a refractory metal such as Mo, W, Ta or Ti, or a film of a silicide of such a refractory metal, or a multilayer film formed by laminating the above-described refractory metal film or silicide film on a polycrystalline silicon film.

Figure 10:
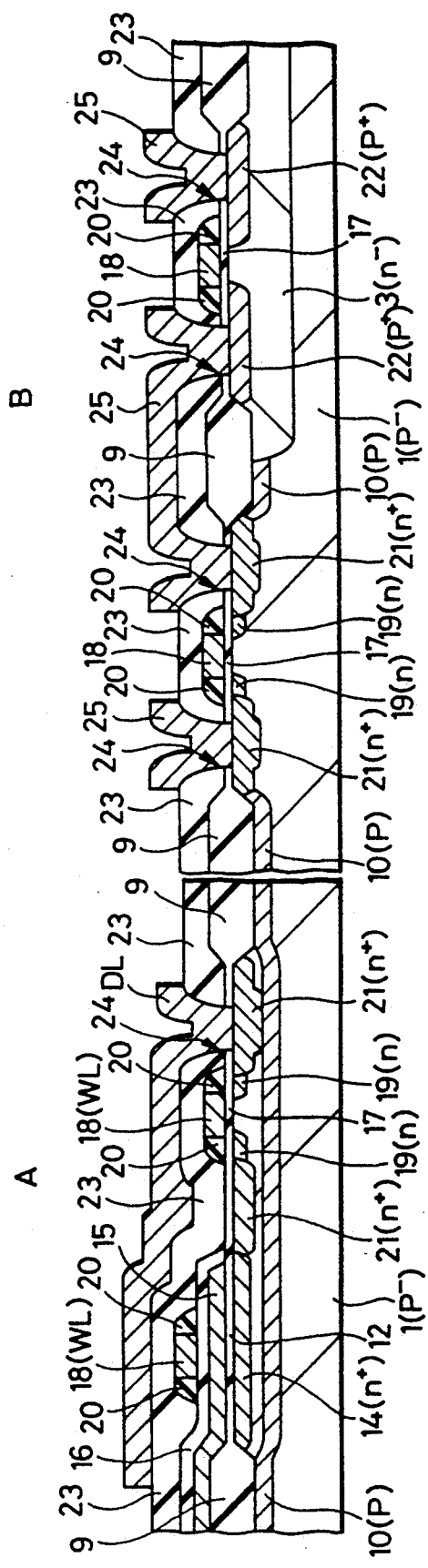

Then, as shown in FIG. 10, in the regions A and B are formed an n-type semiconductor region 19 as a part of each of the source and drain regions of each N-channel MISFET, side wall spacers 20 formed from a silicon oxide film, an n+-type semiconductor region 21 as a part of each of the source and drain regions of each N-channel MISFET, p+-type semiconductor regions 22 as the source and drain regions of each P-channel MISFET, an insulator film 23 defined by a phosphosilicate glass (PSG) film formed by, for example, CVD, contact holes 24, and data lines DL as well as conductor layers 25 formed from an aluminum film by, for example, sputtering. A method of producing a peripheral circuit is described in the specification of U.S. patent application Ser. No. 731,975 filed on May 8, 1985. NMOS's in the memory cell region are formed in a process similar to that for producing NMOS's in the peripheral circuit.

As has been described above, in the region A a p-type impurity, for example, boron (B), for forming the channel stopper region 10A is introduced after the formation of the field insulator film 9, thereby reducing the degree to which the channel stopper region 10A oozes out into the channel region. Thus, the threshold value of the selecting MISFET of each memory cell can be lowered, and therefore the speed of read and write operations of the device can be increased.

Figure 11:
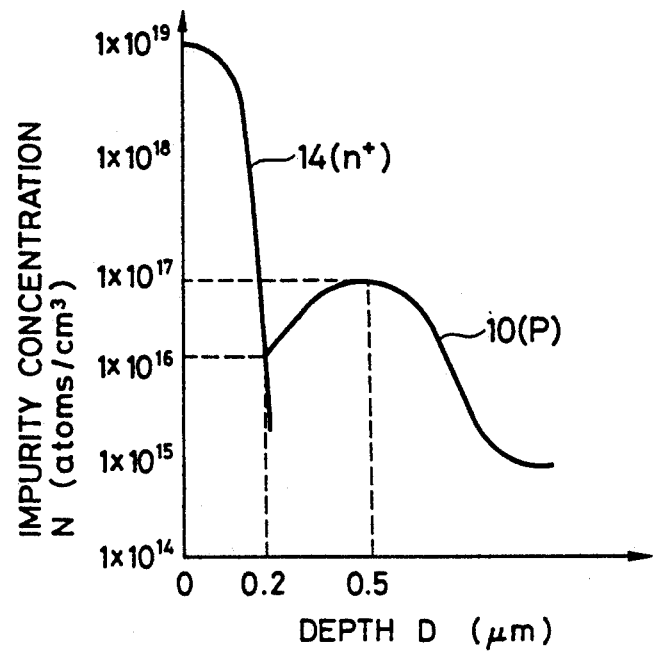
FIG. 11 is a graph showing concentration profiles of semiconductor regions.

Further, in the region A the p-type semiconductor region 10B, which is formed under the n+-type semiconductor region 14 serving as one electrode of the capacitance element, serves as a barrier against minority carriers in the semiconductor substrate 1. Further, impurity ions which are implanted to form a p-type semiconductor region are distributed around a position which is 0.5 μm deep from the surface of the semiconductor substrate as shown in FIG. 11, thus increasing the PN junction capacitance between the p-type semiconductor region and the n+-type semiconductor region 14.

The impurity concentration in the p-type channel stopper region 10A in the surface of the semiconductor substrate 1 at the bird s beak portion of the field insulator film 9 is lower than that in the p-type channel stopper region 10A in the surface of the substrate 1 at portions of the field insulator film 9 other than the bird's beak portion. This is because, the peak of the p-type impurity concentration at the bird's beak portion is located deeper than the surface of the semiconductor substrate 1. Accordingly, the dielectric strength at the junction between the n+-type semiconductor region 14 and the p-type channel stopper region 10A is higher than that in the case where the channel stopper region is formed by ion implantation of an impurity of the same concentration carried out before the formation of the field insulator film.

Further, the p-type semiconductor region 10B is provided under the n-type semiconductor regions 19 and the n+-type semiconductor regions 21 which define the source and drain regions of the selecting MISFET. The p-type semiconductor region 10B serves as a barrier against minority carriers which would otherwise enter the n-type semiconductor regions 19 or the n+-type semiconductor regions 21.

On the other hand, in the region B no p-type semiconductor region 10B is formed under the n-type semiconductor regions 19 and the n+-type semiconductor regions 21 which define the source and drain regions of the N-channel MISFET. Thus, it is possible to suppress the increase in the junction capacitance at the source and drain regions of the N-channel MISFET in the region B, and therefore it is possible to increase the operating speed of the device.

It should be noted that the ion implantation for forming the p-type channel stopper region 10A and the p-type semiconductor region 10B may be carried out in two steps. For example, the first ion implantation may be carried out at about 200 KeV, and the second ion implantation may be effected at about 300 KeV. The alternative ion implantation method enables prevention of the concentration profile from becoming steep.

Further, the process may be modified in such a manner that, after the step shown in FIG. 7, the mask 11 defined by a resist film is removed, and a new mask, which is defined by a resist film having a pattern whereby the capacitance element region alone is exposed, is formed on the semiconductor substrate 1 to introduce a p-type impurity into the capacitance element region again. This alternative procedure enables adjustment of the impurity concentration distribution in the p-type semiconductor region 10B under the n+-type semiconductor region 14 in the capacitance element region.

Also, the process may be modified in such a manner that, after the step shown in FIG. 7, the mask 11 is removed, and a new mask, which is defined by a resist film having a pattern whereby the field insulator film 9 in the region A is exposed alone, is formed on the semiconductor substrate 1 to introduce a p-type impurity under the field insulator film 9 in the region A again. This alternative procedure enables adjustment of the impurity concentration in the channel stopper region 10A in the region A.

Figure 12:
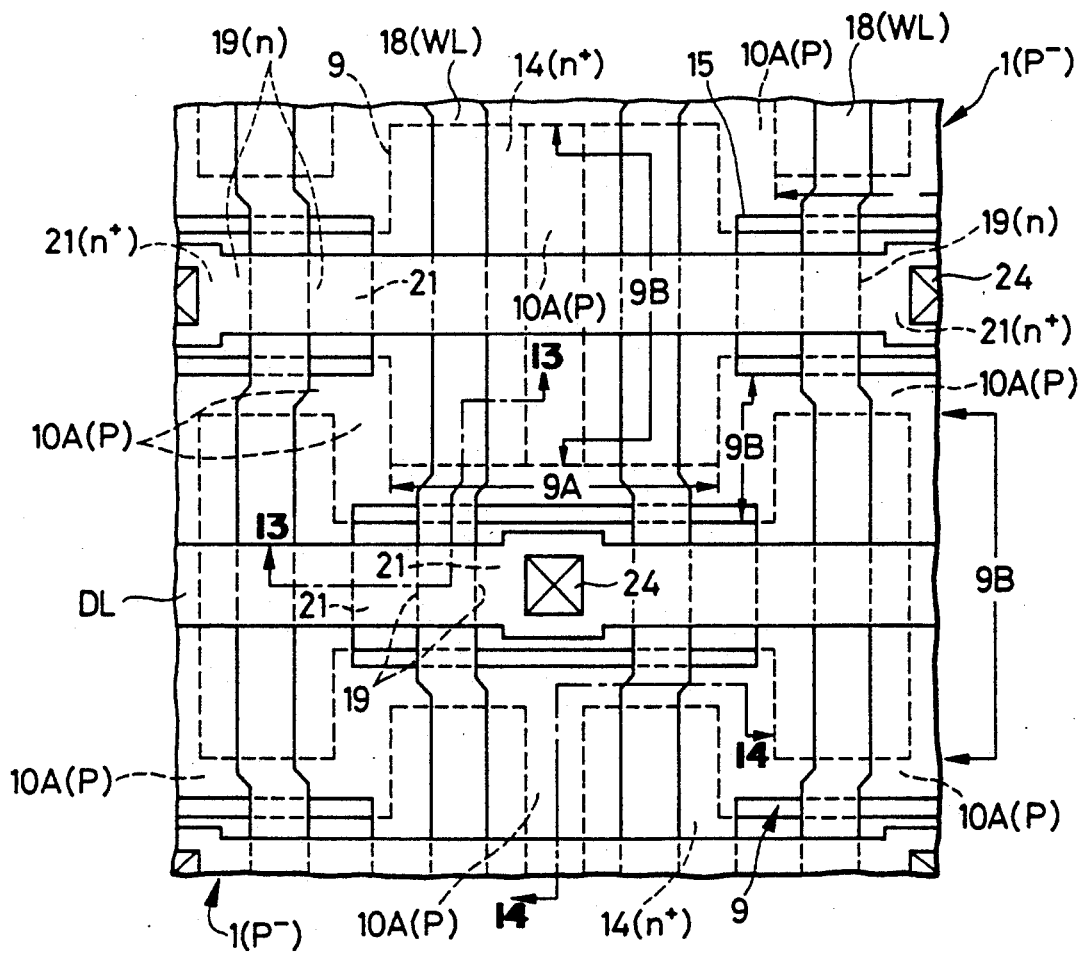
FIG. 12 is a plan view of a memory cell in a semiconductor memory device in accordance with the embodiment II.
Figure 13:
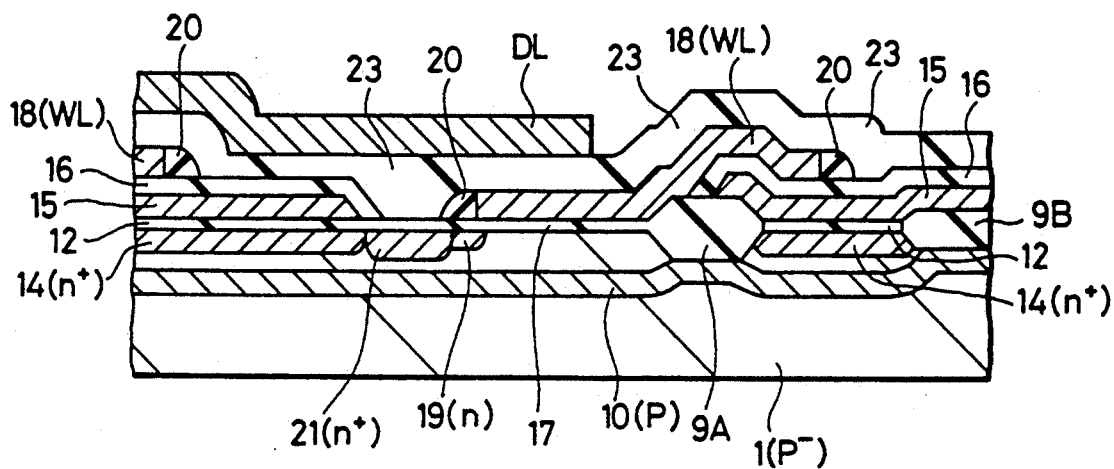
FIG. 13 is a sectional view taken along the line A—A of FIG. 12.
Figure 14:
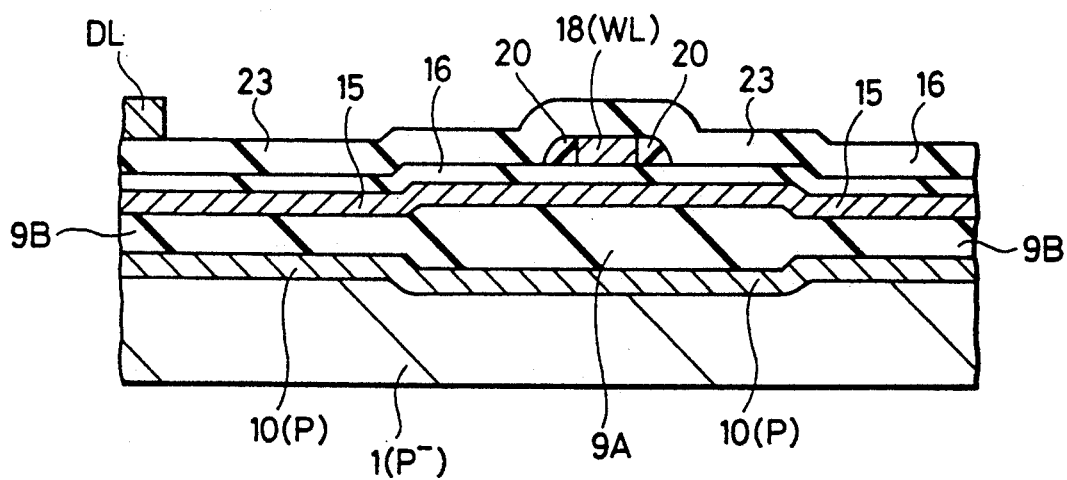
FIG. 14 is a sectional view taken along the line B—B of FIG. 12.
Figure 15:
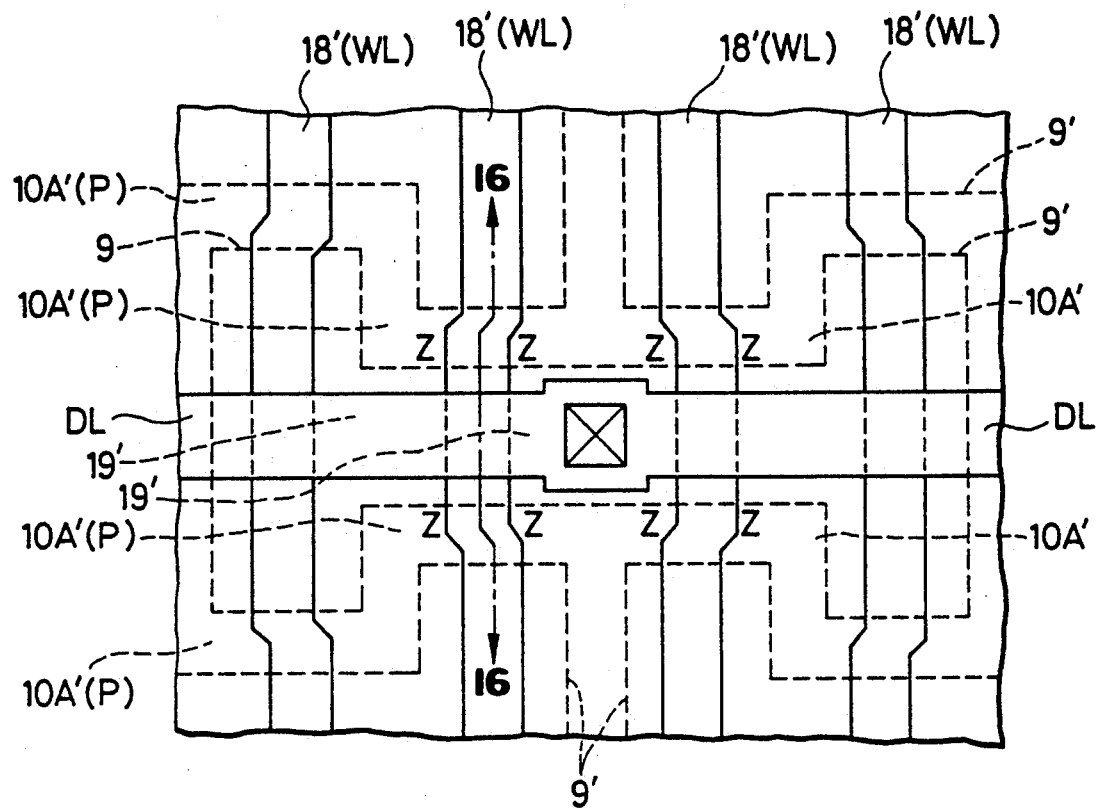
FIG. 15 is a plan view of a part of a MISFET forming region in which a channel stopper is formed using a conventional technique.
Figure 16:
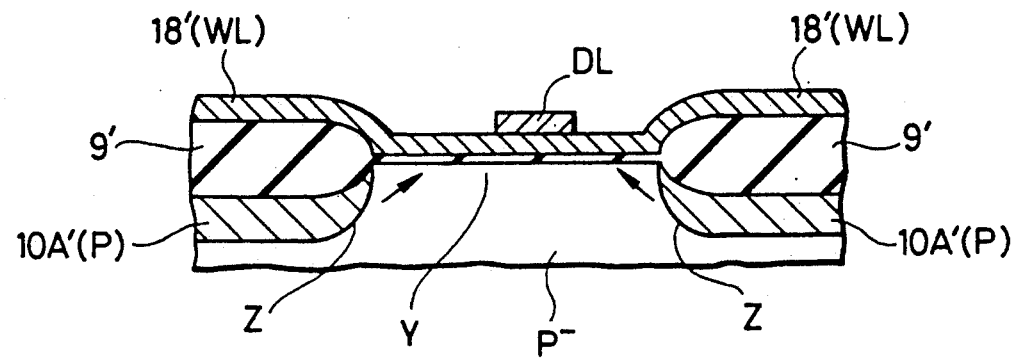
FIG. 16 is a sectional view taken along the line A'—A' of FIG. 15.

FIG. 12 is a plan view of a memory cell in a dynamic RAM in accordance with the embodiment II, while FIG. 13 is a sectional view taken along the line A—A of FIG. 12, and FIG. 14 is a sectional view taken along the line B—B of FIG. 12. It should be noted that FIG. 12 illustrates no insulator films other than the field insulator film 9 in order to facilitate understanding of the arrangement of the memory cell.

In this embodiment, a field insulator film 9A which is located at one side of a selecting MISFET of a memory cell, that is, under a word line WL, is formed so as to be relatively thick, i.e., about 4500 Å, while a field insulator film 9B which is located between adjacent capacitance elements is formed so as to be relatively thin, i.e., about 2500 to about 3000 Å.

A p-type channel stopper region 10 in this embodiment is formed by a method similar to that in the embodiment I, wherein an impurity is introduced after the formation of the field insulator film 9.

If it is so set that the peak of concentration profile of the p-type channel stopper region 10A is located at the surface of the semiconductor substrate 1 under the thick field insulator film 9A, the surface impurity concentration of the p-type channel stopper region 10A under the thin field insulator film 9B is lowered but can be set at such a level that it is possible to adequately isolate adjacent cells from each other. This structure can be achieved in a single ion implantation without using a mask defined by a resist film.

Since the concentration in the p-type channel stopper region 10A under the thin field insulator film 9B is lowered, it is possible to reduce the width of the isolating region and ensure an increased storage capacity while maintaining the PN junction dielectric strength at a relatively high level.

Although the present invention has practically been described above on the basis of the embodiments, it should be noted here that the present invention is not necessarily limited to the described embodiments and various changes and modifications may, of course, be imparted thereto without departing from the gist and spirit of the invention.

For example, the present invention may be applied to static RAM's (S-RAM's) and may also be applied to mask-programmed ROM's, EPROM's (Electrically Programmable ROM's) and EEPROM's (Electrically Erasable and Programmable ROM's).

In addition, the gate electrodes 18 and the word lines WL may be formed from a film of a refractory metal such as Mo, W, Ta or Ti, or a film of a silicide of such a refractory metal, or a multilayer film formed by laminating said refractory metal film or silicide film on a polycrystalline silicon film. Thus, a p-type impurity for forming the p-type channel stopper region 10A is prevented from readily entering a region under the channel region of a selecting MISFET, so that it is possible to lower the threshold value of the MISFET.

What is claimed is:

1. A method of manufacturing a semiconductor memory device, comprising the steps of:
   providing a semiconductor substrate having a main surface, said main surface including a memory cell region in which a plurality of memory cells are to be formed, and including a peripheral circuit region in which a peripheral circuit is to be formed, wherein said memory cell region includes first active regions of a first conductivity type and a first region between said first active regions, and wherein said peripheral circuit region in which a peripheral circuit is to be formed, wherein said memory cell region includes first active regions of a first conductivity type and a first region between said first active regions, and wherein said peripheral circuit region includes second active regions of said first conductivity type and a second region between said second active regions;

selectively introducing first impurities of the first conductivity type into said second region without introducing said first impurities into said memory cell region, in order to form a first channel stopper layer of the first conductivity type in said section region;

after the step of selectively introducing said first impurities of the first conductivity type, selectively forming an isolation oxide film in said first and second regions by thermally oxidizing said main surface of said substrate at said first and second regions, said first channel stopper layer being disposed under said isolation oxide film in said second region;

after the step of selectively forming said isolation oxide film, introducing second impurities of the first conductivity type into said first region in said memory cell region, through said isolation oxide film, and into said first active regions in said memory cell region, in order to form a second channel stopper layer of the first conductivity type under isolation oxide film in said first region and a first semiconductor layer of the first conductivity type under said active regions in said memory cell region, said first semiconductor layer having a higher impurity concentration than that of said first active regions; and forming first MISFETS in said first active regions, and forming second MISFETS in said active regions, said plurality of memory cells comprising said first MISFETS, said peripheral circuit comprising said second MISFETS.

2. A method of manufacturing a semiconductor memory device according to claim 1, wherein the step of selectively introducing said first impurities of the first conductivity type, and the step of introducing said second impurities of the first conductivity type, include an ion implantation respectively, and wherein said ion implantation in the step of introducing said second impurities is performed at an implantation energy higher than that of said ion implantation in the step of selectively introducing said first impurities.

3. A method of manufacturing a semiconductor memory device according to claim 1, wherein the step of forming said fist MISFETs includes forming a gate insulating film on said first active regions, forming a gate conductor layer of each of said first MISFETs on said gate insulting film, and forming second semiconductor layers of a second conductivity type, opposite to the first conductivity type, of each of said first MISFETs, in said first active regions, and wherein said second semiconductor layers of the second conductivity type are formed at both sides of said gate conductor layer.

4. A method of manufacturing a semiconductor memory device according to claim 3, further comprising the step of forming capacitance elements electrically coupled to said second semiconductor layers, with a capacitance element being electrically coupled to one of the second semiconductor layers which are at both sides of the gate conductive layer of a respective first MISFET, thereby to form said plurality of memory cells comprised of said capacitance elements and said first MISFETs.

5. A method of manufacturing a semiconductor memory device according to claim 4, wherein the other of said second semiconductor layers of said second conductivity type which are at both sides of the gate conductor layer is formed in self-alignment with said gate conductor layer and said isolation oxide film.

6. A method of manufacturing a semiconductor memory device according to claim 1, wherein said second channel stopper layer is formed in contact with the bottom of said isolation oxide film.

7. A method of manufacturing a semiconductor memory device according to claim 1, wherein said first semiconductor layer of the first conductivity type is integrally formed with said second channel stopper layer in said semiconductor substrate.

8. A method of manufacturing a semiconductor memory device according to claim 1, wherein the second impurities of the first conductivity type are introduced to form the second channel stopper layer and the first semiconductor layer simultaneously.

9. A method of manufacturing a semiconductor memory device according to claim 8, wherein the second channel stopper layer and the first semiconductor layer are integral with each other.

10. A method of manufacturing a semiconductor memory device according to claim 9, wherein the second impurities introduced to form the first semiconductor layer are introduced deeper into the semiconductor substrate that the second impurities introduced to form the second channel stopper layer.

11. A method of manufacturing a semiconductor memory device according to claim 1, further comprising a step of introducing third impurities of the first conductivity type through the isolation oxide film in said first region so as to adjust the impurity concentration of the second channel stopper layer.

12. A method of manufacturing a semiconductor memory device, comprising the steps of:

preparing a semiconductor substrate with first and second oxidation impermeable films on a main surface of said semiconductor substrate, said main surface including a memory cell portion of a first conductivity type in which a plurality of memory cells are to be formed and including a peripheral circuit portion of said first conductivity type in which a peripheral circuit is to be formed, wherein said first oxidation impermeable film is selectively formed on said main surface so as to cover a first portion of said memory cell portion and said second oxidation impermeable film is selectively formed on said main surface so as to cover a second portion of said peripheral circuit portion, wherein said main surface further includes an impurity implanted region of the first conductivity type which is in said peripheral circuit portion and comprises first impurities of the first conductivity type introduced in self-alignment to said second oxidation impermeable film;

after the step of preparing said semiconductor substrate with first and second oxidation impermeable films, selectively forming an isolation oxide film in said memory cell portion and said peripheral circuit portion by thermally oxidizing said main surface of said substrate exposed to form said first and second oxidation impermeable films, said impurity implanted region being disposed under said isolation oxide film in said peripheral circuit portion;

after the step of selectively forming said isolation oxide film, introducing second impurities of the first conductivity type into said main surface of said memory cell portion surrounding and adjoining said first portion, through said isolation oxide film in said memory cell portion, and into said first portion of said memory cell portion, in order to form a first semiconductor layer of the first conductivity type under said isolation oxide film and a second semiconductor layer of the first conductivity type under said first portion of said memory cell portion, said second semiconductor layer having a higher impurity concentration than that of said memory cell portion and being integrally formed with said first semiconductor layer in said substrate;

forming a first gate insulating film on said first portion of said memory cell portion and a second gate insulating film on said second portion of said peripheral circuit portion respectively;

forming a first gate conductor layer on said first gate insulating film and a second gate conductor layer on said second gate insulating film respectively;

introducing third impurities of a second conductivity type, opposite to said first conductivity type, into said first portion of said memory cell portion so as to form a third semiconductor layer of the second conductivity type in said first portion of said memory cell portion, said third semiconductor layer of the second conductivity type being formed in self-alignment to said first gate conductor layer and said isolation oxide film in said memory cell portion, and introducing the third impurities of the second conductivity type into said second portion of said peripheral circuit portion so as to form fourth and fifth semiconductor layers of the second conductivity type in said second portion of said peripheral circuit portion, said fourth and fifth semiconductor layers of the second conductivity type being formed in self-alignment to said second gate conductor layer and said isolation oxide film in said peripheral circuit portion, thereby to form a first MISFET comprising said first gate insulating film, said first gate conductor layer and said third semiconductor layer and to form a second MISFET comprising said second gate insulating film, said second gate conductor layer and said fourth and fifth semiconductor layers, said plurality of memory cells comprising said first MISFET, and said peripheral circuit comprising said second MISFET.

13. A method of manufacturing a semiconductor memory device according to claim 12, wherein said first impurities of the first conductivity type and said second impurities of the first conductivity type are introduced by an ion implantation, respectively, and wherein said ion implantation of said second impurities is performed at an implantation energy higher than that of said ion implantation of said first impurities.

14. A method of manufacturing a semiconductor memory device according to claim 12, further comprising the step of forming a sixth semiconductor layer of the second conductivity type, in said first portion of said memory cell portion, and the step of forming capacitance elements electrically coupled to said sixth semiconductor layer in said memory cell portion, thereby to form said plurality of memory cells comprising said capacitance element and said first MISFET.

15. A method of manufacturing a semiconductor memory device according to claim 14, wherein the third and sixth semiconductor layers of said second conductivity type are source and drain regions of said first MISFET.

16. A method of manufacturing a semiconductor memory device according to claim 12, wherein said fourth and fifth semiconductor layers are source and drain regions of said second MISFET.

17. A method of manufacturing a semiconductor memory device according to claim 12, wherein said impurity planted region of the first conductivity type is in contact with the bottom of said isolation oxide film in said peripheral circuit portion and is used as a channel stopper layer for said peripheral circuit.

18. A method of manufacturing a semiconductor memory device according to claim 12, wherein said first semiconductor layer of the first conductivity type is in contact with the bottom of said isolation oxide film in said memory cell portion and is used as a channel stopper layer for said plurality of memory cells.

19. A method of manufacturing a semiconductor memory device according to claim 12, wherein said first and second oxidation impermeable films comprise a silicon nitride layer respectively.

20. A method of manufacturing a semiconductor memory device according to claim 12, further comprising a step of removing said first and second oxidation impermeable films from said main surface of said semiconductor substrate, after the formation of said isolation oxide film, and prior to the introduction of said second impurities of the first conductivity type.

21. A method of producing a semiconductor memory device, comprising the steps of:

providing a semiconductor substrate having a principal surface, said substrate having a memory cell region in which a plurality of memory cells are to be formed and a peripheral circuit region in which a peripheral circuit is to be formed, wherein said memory cell region includes first active regions of a first conductivity type and a first isolation region between said first active regions, and wherein said peripheral circuit region includes second and third active regions and a second isolation region for isolating said second and third active regions from each other, the second active region having a second conductivity type opposite to the first conductivity type;

selectively introducing first impurities of the first conductivity type into the principal surface on said peripheral circuit region without introducing said first impurities into the memory cell region, in order to form a first channel stopper region in said second isolation region;

after the step of selectively introducing said first impurities, selectively forming a first insulator film on the principal surface of said substrate at said first isolation region in said memory cell region and a second insulator film on the principal surface of said substrate in said peripheral circuit region, respectively, said first channel stopper region being disposed under said second insulator film;

after the step of selectively forming the first and second insulator films, implanting second impurities of the first conductivity type into said first isolation region in said memory cell region, through said first insulator film, and into said first active regions in said memory cell region, to thereby form a second channel stopper region of the first conductivity type under said first insulator film and an impurity-introduced region of the first conductivity type under said first active regions, said impurity-introduced region being integrally formed with said second channel stopper region in said substrate and having a higher concentration than that of said first active regions; and forming first MISFETs of said memory cells in said first active regions, and forming second and third MISFETs of said peripheral circuit in said second and third active regions, respectively.

22. A method of manufacturing a semiconductor memory device according to claim 21, wherein as depth of an upper surface of said impurity-introduced region, from the principal surface of the substrate, is greater than a depth of an upper surface of said second channel stopper region from the principal surface of the substrate.

23. A method of manufacturing a semiconductor memory device according to claim 21, including the further step of forming a capacitance element, included in each of said memory cells, in said first active regions within said memory cell region.

24. A method of producing a semiconductor memory device according to claim 21, wherein the second channel stopper region is formed in contact with a bottom of the first insulator film.

25. A method of manufacturing a semiconductor memory device according to claim 21, wherein each of said memory cells is a memory cell of a dynamic random access memory.

26. A method of manufacturing a semiconductor memory device according to claim 21, wherein the first impurities are selectively introduced only into the principal surface of said peripheral circuit region.

27. A method of manufacturing a semiconductor memory device, comprising the steps of:
   (a) providing a semiconductor substrate having a main surface, said substrate having a memory cell region in which a plurality of memory cells are to be formed, and having a peripheral circuit region in which a peripheral circuit is to be formed, wherein said memory cell region includes first active regions of a first conductivity type and a first active regions between said first active regions, and wherein said peripheral circuit region includes second active regions and a second isolation region for isolating said second active regions from each other;
   (b) selectively forming a mask film on said main surface of said substrate so that said mask film covers first active regions and said first isolation region in said memory cell region and said second active regions in said peripheral circuit region;
   (c) selectively introducing first impurities of said first conductivity type into said main surface of said substrate by using said mask film as a mask, to form a first channel stopper region of said first conductivity type at said second isolation region in said peripheral circuit region;
   (d) after the step (c), selectively forming an isolation oxide film on said main surface of said substrate so that said isolation oxide film is disposed at said first and second isolation regions;

(e) after the step (d), introducing second impurities of said first conductivity type into said first isolation region in said memory cell region of said substrate, through said isolation oxide film, and into said first active regions in said memory cell region, thereby to form a second channel stopper region of said first conductivity type under said isolation oxide film and a barrier region under said first active regions, said barrier region being integrally formed with said second channel stopper region in said substrate and having a higher impurity concentration than that of said first active regions of said memory cell region.

28. A method of manufacturing a semiconductor memory device according to claim 27, wherein said barrier region is a region serving as a potential barrier against minority carriers generated by α-rays entering the semiconductor substrate.

29. A method of manufacturing a semiconductor memory device according to claim 27, wherein said mask film comprises an oxidation impermeable film, and wherein the step (d) includes, after selectively removing said oxidation impermeable film which is disposed at said first isolation region, selectively oxidizing said main surface of said substrate in said first and second isolation regions by using said oxidation impermeable film as a mask, to form said isolation oxide film at said first and second isolation regions.

30. A method of producing a semiconductor memory device according to claim 27, further comprising the steps of:
   forming first MISFETs in said first active regions of said memory cell region, wherein each of said memory cells comprises a respective one of said first MISFETs; and
   forming second MISFETs in said second active regions of said peripheral circuit region, wherein said peripheral circuit region comprises said second MISFETs.

31. A method of manufacturing a semiconductor memory device according to claim 30, further comprising the step of forming capacitance elements in said memory cell region, thereby to form said memory cells comprised of said capacitance elements and said first MISFETs.

32. A method of producing a semiconductor memory device according to claim 27, wherein the step (c) of selectively introducing first impurities of said first conductivity type, and the step (e) of introducing second impurities of said first conductivity type, each includes an ion implantation, and wherein said ion implantation in the step (e) is performed at an implantation energy higher than that of said implantation in the step (c).

33. A method of producing a semiconductor memory device according to claim 27, wherein the first impurities are selectively introduced only into the main surface of said peripheral circuit region.

34. A method of manufacturing a semiconductor memory device, comprising the steps of:
   (1) providing a semiconductor substrate having a main surface of a first conductivity type, selectively forming a first oxidation impermeable film and a second oxidation impermeable film on said main surface of said semiconductor substrate so as to cover a first region and a second region of said main surface of said semiconductor substrate respectively, introducing first impurities of the first conductivity type into said main surface of said semiconductor substrate in order to selectively form a first semiconductor layer only in said main surface of said semiconductor substrate in self-alignment with said second oxidation impermeable film, said first semiconductor layer surrounding and adjoining said second region;

(2) after the step (1), thermally oxidizing said main surface of said semiconductor substrate exposed from said first and second oxidation impermeable films, to selectively form an isolation oxide film on said main surface of said semiconductor substrate, said isolation oxide film surrounding and adjoining each of said first and second regions;

(3) after the step (2), introducing second impurities of the first conductivity type into said main surface surrounding and adjoining said first region through said isolation oxide film, and into said first region, thereby to form a second semiconductor layer of the first conductivity type under said isolation oxide film surrounding said first region and to form a third semiconductor layer of the first conductivity type in said main surface of said semiconductor substrate in said first region simultaneously, each of said second and third semiconductor layers having a higher impurity concentration than that of said main surface of said semiconductor substrate;

(4) forming a first gate insulating film and a second gate insulating film on said main surface of said semiconductor substrate in said first and second regions respectively;

(5) forming a first gate conductor layer and a second gate conductor layer on said first and second gate insulating films respectively; and (6) introducing third impurities of a second conductivity type, opposite to the first conductivity type, into said first and second regions respectively, defined by said isolation oxide film and said first and second gate conductor layers, thereby to form a fourth semiconductor layer of the second conductivity type and a fifth semiconductor layer of the second conductivity type in said main surface of said semiconductor substrate in said first and second regions respectively, whereby a first MISFET included in a memory cell comprises said first gate insulating film, said first gate conductor layer and said fourth semiconductor layer, and a second MISFET included in a peripheral circuit comprises said second gate insulating film, said second gate conductor layer and said fifth semiconductor layer.

35. A method of manufacturing a semiconductor memory device according to claim 34, further comprising the step of forming a mask layer on said main surface of said semiconductor substrate so as to cover said second region, prior to the step (3).

36. A method of manufacturing a semiconductor memory device according to claim 34, wherein each of said first and second oxidation impermeable films comprises a silicon nitride film.

37. A method of manufacturing a semiconductor memory device according to claim 34, wherein the step (1) of selectively introducing first impurities of said first conductivity type, and the step (3) of introducing second impurities of said first conductivity type, each includes an ion implantation, and wherein said ion implantation in the step (3) is performed at an implantation energy higher than that of said implantation in the step (1).

38. A method of manufacturing a semiconductor memory device according to claim 34, further comprising a step of removing said first and second oxidation impermeable films from said main surface of said semiconductor substrate, after the formation of said isolation oxide film in the step (2), and prior to the introduction of said second impurities in the step (3).

39. A method of manufacturing a semiconductor memory device according to claim 34, wherein said first conductivity type is P-type, and said second conductivity type is N-type.

40. A method of manufacturing a semiconductor memory device according to claim 34, further comprising a step of forming a capacitance element electrically connected to said fourth semiconductor layer on said main surface of said semiconductor substrate in said first region, thereby to form said memory cell comprised of said first MISFET and said capacitance element.

41. A method of manufacturing a semiconductor memory device according to claim 40, wherein the step of forming the capacitance element includes forming a dielectric film on a surface of said fourth semiconductor layer and forming a conductive layer on said dielectric film.

42. A method of manufacturing a semiconductor memory device according to claim 41, wherein said memory cell is a memory cell of a dynamic random access memory.

43. A method of manufacturing a semiconductor memory device according to claim 34, wherein said fourth semiconductor layer is one of source and drain regions of said first MISFET.

44. A method of manufacturing a semiconductor memory device according to claim 34, wherein said fifth semiconductor layer is one of source and drain regions of said second MISFET.

45. A method of manufacturing a semiconductor memory device according to claim 34, wherein said isolation oxide film surrounding said second region is formed so as to surround said second region in a plane view, and wherein said first semiconductor layer is in contact with a bottom of said isolation oxide film surrounding said second region and is formed as a channel stopper layer of said peripheral circuit.

46. A method of manufacturing a semiconductor memory device according to claim 34, wherein said isolation oxide film surrounding said first region is formed so as to surround said first region in a plane view, and wherein said second semiconductor layer is formed in contact with a bottom of said isolation oxide film surrounding said first region and is formed as a channel stopper layer of said memory cell.

47. A method of manufacturing a semiconductor integrated circuit device, comprising the steps of:
a) providing a semiconductor substrate having a main surface of one conductivity type, the semiconductor substrate having a first resistivity;
b) covering said main surface of said semiconductor substrate with an oxidation-impermeable material so as to cover at least first and second selected surface areas of said main surface and leave another surface area of said main surface, which is other than said first and second selected surface areas, uncovered by said oxidation-impermeable material;
c) introducing first impurities of a same conductivity type as that of said main surface into a first portion of the other surface area, which surrounds and adjoins said second selected surface area, without introducing said first impurities into said first selected surface area and without introducing said first impurities into a second portion of said other surface area which surrounds and adjoins said first selected surface area, thereby to form, in said main surface, a first region of the one conductivity type which is located at said first portion of said other surface area, said first region having a resistivity lower than said first resistivity, said first region being formed in self-alignment with said oxidation-impermeable material covering said second selected surface area, so as to form a first-introduced structure;

d) subjecting said first-introduced structure to an oxidation treatment so as to selectively oxidize said main surface by using said oxidation-impermeable material as a mask, thereby to form a first oxide film which covers said other surface area and surrounds said first and second selected surface areas;

e) introducing second impurities of the same conductivity type as that of said main surface into said first selected surface area surrounded by said first oxide film, and into said second portion of said other surface area through said first oxide film, thereby to form a second region of the one conductivity type having a first part thereof which is located at said first selected surface area and is buried in said main surface with a depth from said first selected surface area, and having a second part thereof which is located beneath said first oxide film formed at said second portion of said other surface area and is contiguous with said first part, said second region having a resistivity lower than said first resistivity;

f) forming insulating films on said first and second selected surface areas respectively, the insulating films being thinner than said first oxide film; and g) forming insulated gate field effect transistors at said first and second selected surface areas respectively, said insulated gate field effect transistors including said insulating films as gate insulators.

48. A method of manufacturing a semiconductor integrated circuit device according to claim 47, wherein said semiconductor integrated circuit device includes a memory circuit configuration which is constructed of a memory cell array circuit and a peripheral circuit in relation with said memory cell array circuit, and wherein an associated gate field effect transistor formed in said first selected surface area serves as an active element of said memory cell array circuit while an insulated gate field effect transistor formed in said second selected surface area serves as an active element of said peripheral circuit.

49. A method of manufacturing a semiconductor memory device according to claim 47, further comprising a step of removing said oxidation-impermeable material from said main surface of said semiconductor substrate, after the formation of said first oxide film in the step (d) and prior to the introduction of said second impurities in the step (e).

* * * * *